(12) United States Patent
Hasegawa et al.

(10) Patent No.: US 9,939,200 B2
(45) Date of Patent: Apr. 10, 2018

(54) SUBSTRATE TRANSFER SYSTEM AND HEAT TREATMENT APPARATUS USING SAME

(71) Applicant: TOKYO ELECTRON LIMITED, Tokyo (JP)

(72) Inventors: Koyu Hasegawa, Oshu (JP); Kyoko Ikeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 193 days.

(21) Appl. No.: 14/948,673

(22) Filed: Nov. 23, 2015

(65) Prior Publication Data

US 2016/0146539 A1    May 26, 2016

(30) Foreign Application Priority Data

Nov. 25, 2014  (JP) .................................. 2014-237377

(51) Int. Cl.
*F27D 3/00*   (2006.01)
*H01L 21/47*  (2006.01)

(52) U.S. Cl.
CPC ............ *F27D 3/0084* (2013.01); *H01L 21/47* (2013.01); *F27D 2003/0086* (2013.01)

(58) Field of Classification Search
USPC .................. 432/247, 251, 245; 414/938, 940
See application file for complete search history.

(56) References Cited

U.S. PATENT DOCUMENTS

| | | | | |
|---|---|---|---|---|
| 5,829,939 A * | 11/1998 | Iwai | ................... | H01L 21/67769 414/411 |
| 5,968,593 A * | 10/1999 | Sakamoto | ......... | H01L 21/67109 118/715 |
| 6,331,890 B1 * | 12/2001 | Marumo | ............ | G01B 11/0683 356/364 |
| 7,795,157 B2 * | 9/2010 | Terasaki | .............. | C23C 16/4412 118/61 |
| 8,513,578 B2 * | 8/2013 | Shimizu | ............ | H01L 21/67115 219/651 |

FOREIGN PATENT DOCUMENTS

JP         06-224145 A    8/1994
JP        2014-003181 A   1/2014

* cited by examiner

*Primary Examiner* — Gregory A Wilson
(74) *Attorney, Agent, or Firm* — Nath, Goldberg & Meyer; Jerald L. Meyer

(57) ABSTRACT

A substrate transfer system includes a substrate transfer part capable of transferring a substrate while holding the substrate, an elevating mechanism including a support axis extending in an upper-lower direction and being capable of moving the substrate transfer part along the support axis within a predetermined range, a first exhaust port located at a position selected from at least one of on the supporting axis and near the supporting axis above an upper limit of the predetermined range, a second exhaust port located at a position selected from at least one of on the supporting axis and near the supporting axis below a lower limit of the predetermined range, and an exhaust part connected such that exhaust is available through the first exhaust port and the second exhaust port.

14 Claims, 14 Drawing Sheets

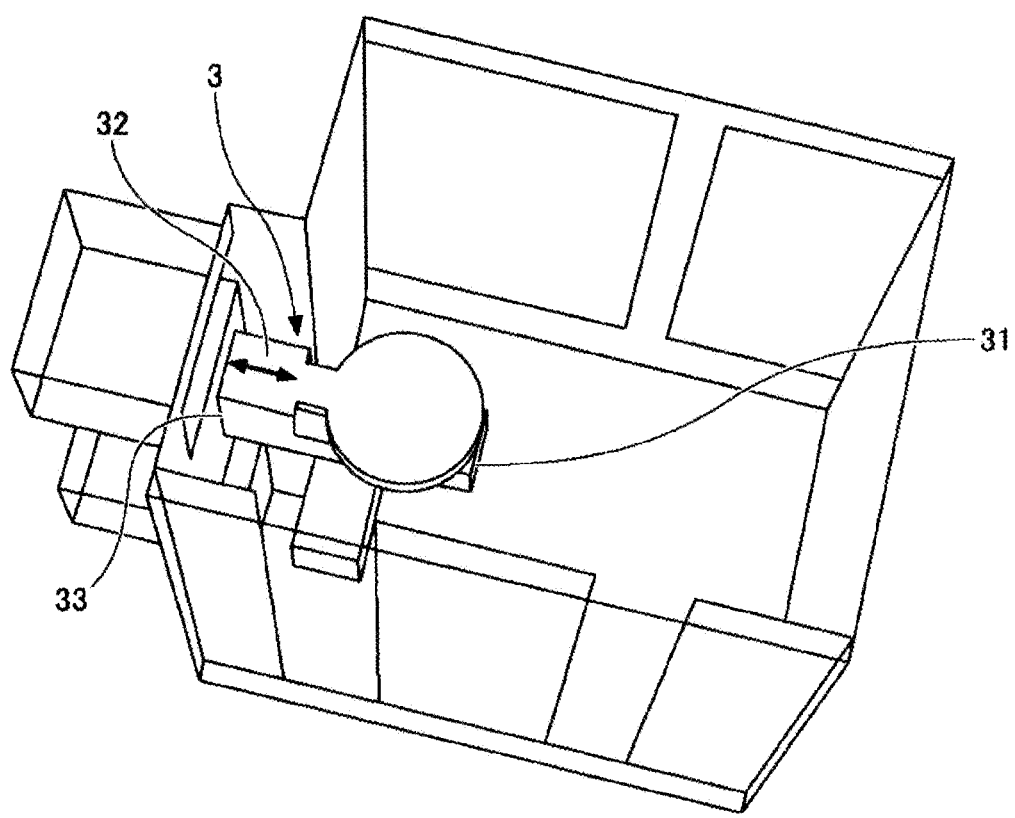

SUBSTRATE TRANSFER SYSTEM AND HEAT TREATMENT APPARATUS USING SAME

CROSS-REFERENCE TO RELATED APPLICATION

This application claims the benefit of Japanese Patent Application No. 2014-237377, filed on Nov. 25, 2014, in the Japan Patent Office, the disclosure of which is incorporated herein in its entirety by reference.

TECHNICAL FIELD

The present disclosure relates to a substrate transfer system and a heat treatment apparatus using the same.

BACKGROUND

Conventional substrate transfer equipment has been known, in which a local exhaust duct formed along the length direction of a ball screw is arranged close to the ball screw between an arm for transferring a wafer while holding the wafer and the ball screw such that a gas suction port for sucking particles faces a side of the ball screw, so as to suppress contamination of a substrate by the particles generated from grease of the ball screw which moves up and down a holding part when the substrate held by the arm is transferred to the holding part. Further, a structure or the like has been also known, in which an elevating mechanism part such as a boat elevator or an elevator for moving a wafer is covered by a flow rectifying plate having a plurality of the holes formed therethrough, and in which circulation flow is formed by sucking a $N_2$ gas supplied from a filter unit in horizontal laminar flow through holes of the flow rectifying plate, and sucking and introducing the same to a return route which connects a rear surface of the flow rectifying plate and the filter.

However, in the substrate transfer equipment, the local exhaust duct needs an extra space and has to be installed in a load area. This poses a problem in that the equipment has a complex configuration.

Besides, in the structure described above, there has been a problem that, if a wafer transfer for moving the wafer is operated to move up and down at a high speed, particles easily enter into a rear area in a movement direction.

SUMMARY

Therefore, the present disclosure provides a substrate transfer system having a simple configuration and effectively suppressing contamination of the substrate by particles generated when a substrate transfer part is moved up and down at a high speed and a heat treatment apparatus using the same.

According to an embodiment of the present disclosure, there is provided a substrate transfer system including a substrate transfer part capable of transferring a substrate while holding the substrate, an elevating mechanism including a support axis extending in an upper-lower direction and being capable of moving the substrate transfer part along the support axis within a predetermined range, a first exhaust port located at a position selected from at least one of on the supporting axis and near the supporting axis above an upper limit of the predetermined range, a second exhaust port located at a position selected from at least one of on the supporting axis and near the supporting axis below a lower limit of the predetermined range, and an exhaust part connected such that exhaust is available through the first exhaust port and the second exhaust port.

According to another embodiment of the present disclosure, there is provided a heat treatment apparatus including the substrate transfer system described above, a processing container installed above the substrate holder elevating mechanism and capable of accommodating the substrate holder by raising the substrate holder elevating mechanism, and a heater heating the processing container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 10A and 10B are explanatory view illustrating an example of a substrate transfer system according to a second embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
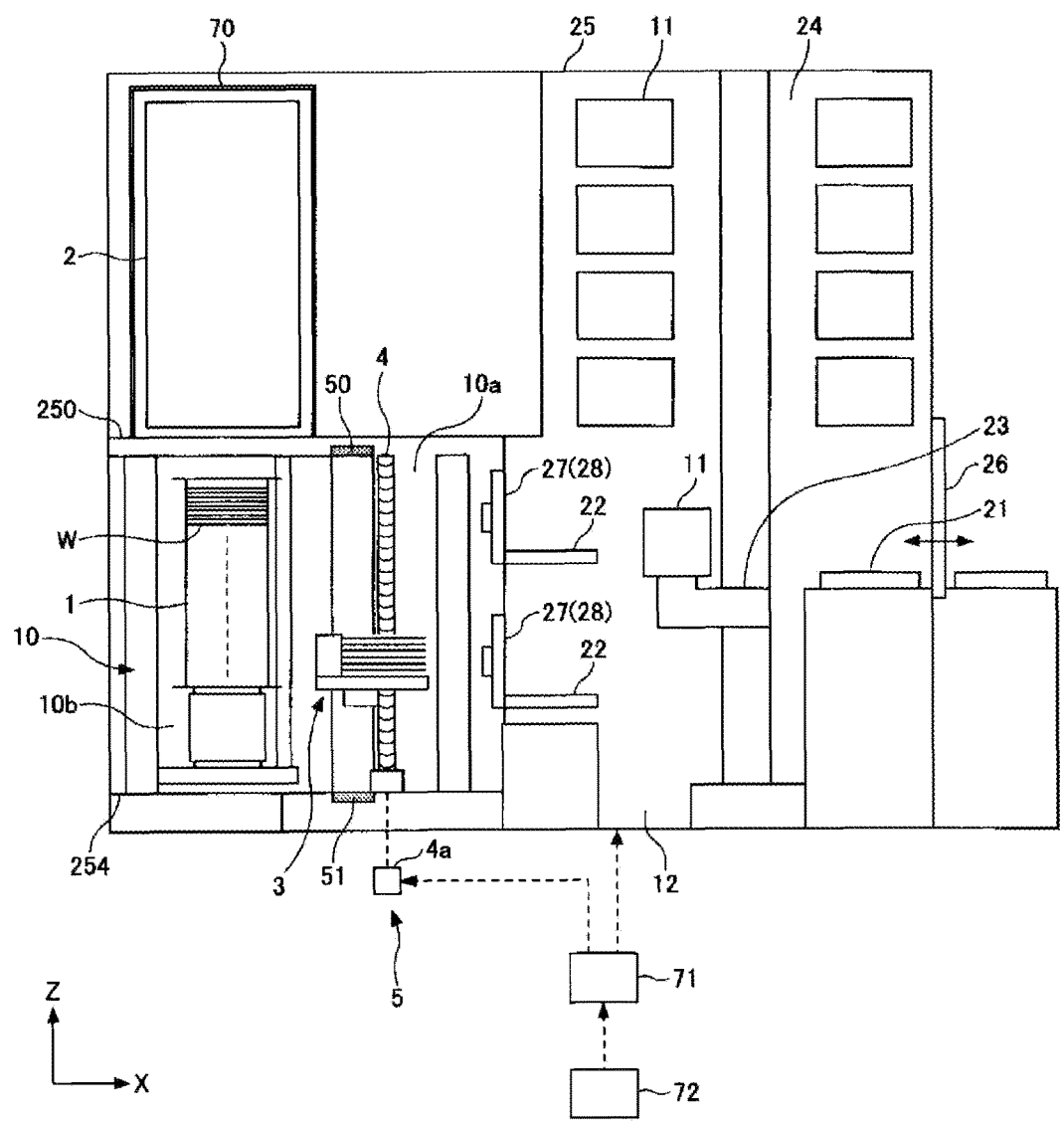
FIG. 1 is a side view illustrating a schematic configuration of an example of a vertical heat treatment apparatus using a substrate transfer system according to a first embodiment of the present disclosure.
Figure 2:
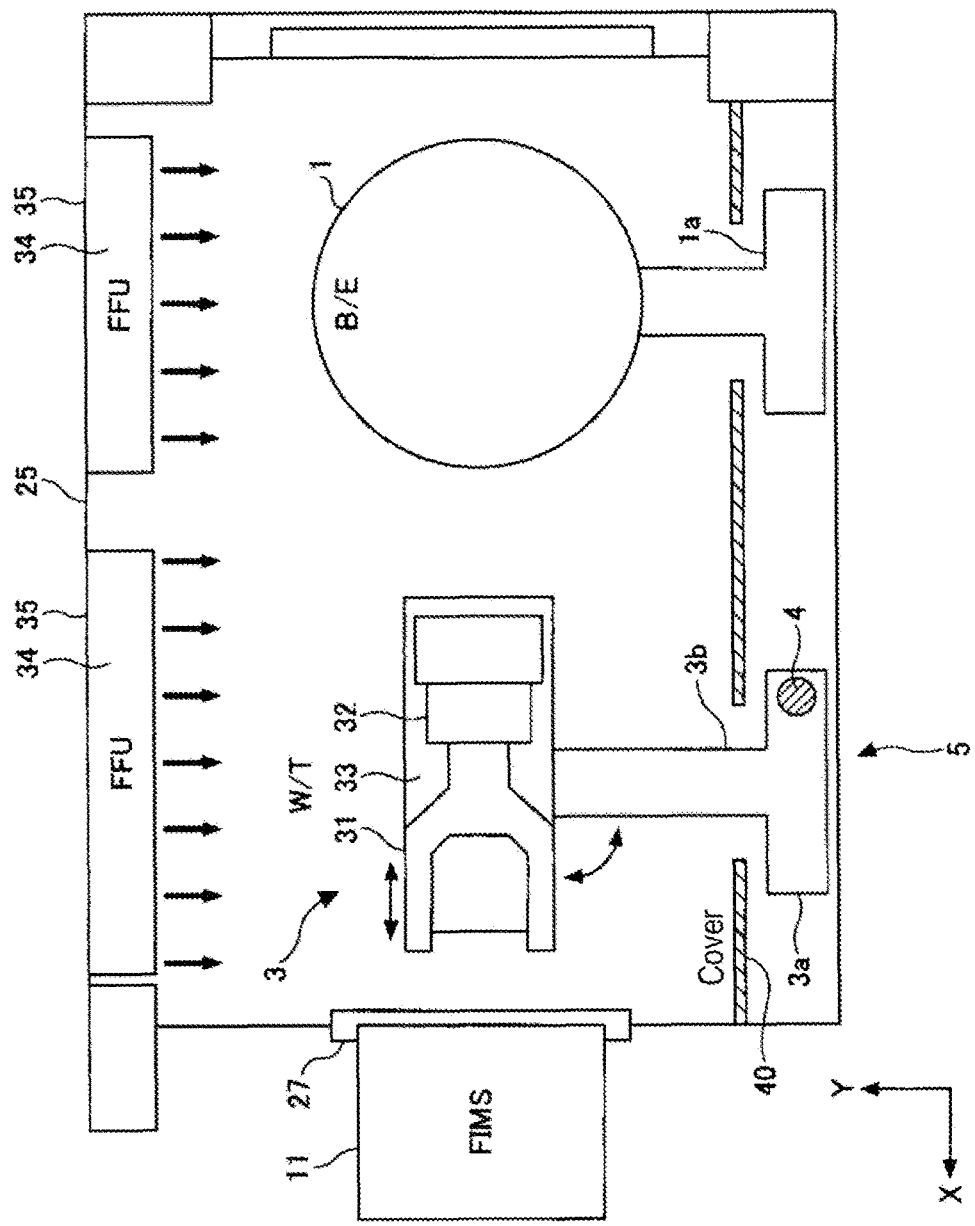
FIG. 2 is a plan view showing a configuration of an example of a heat treatment apparatus using the substrate transfer system according to the first embodiment of the present disclosure.
Figure 3:
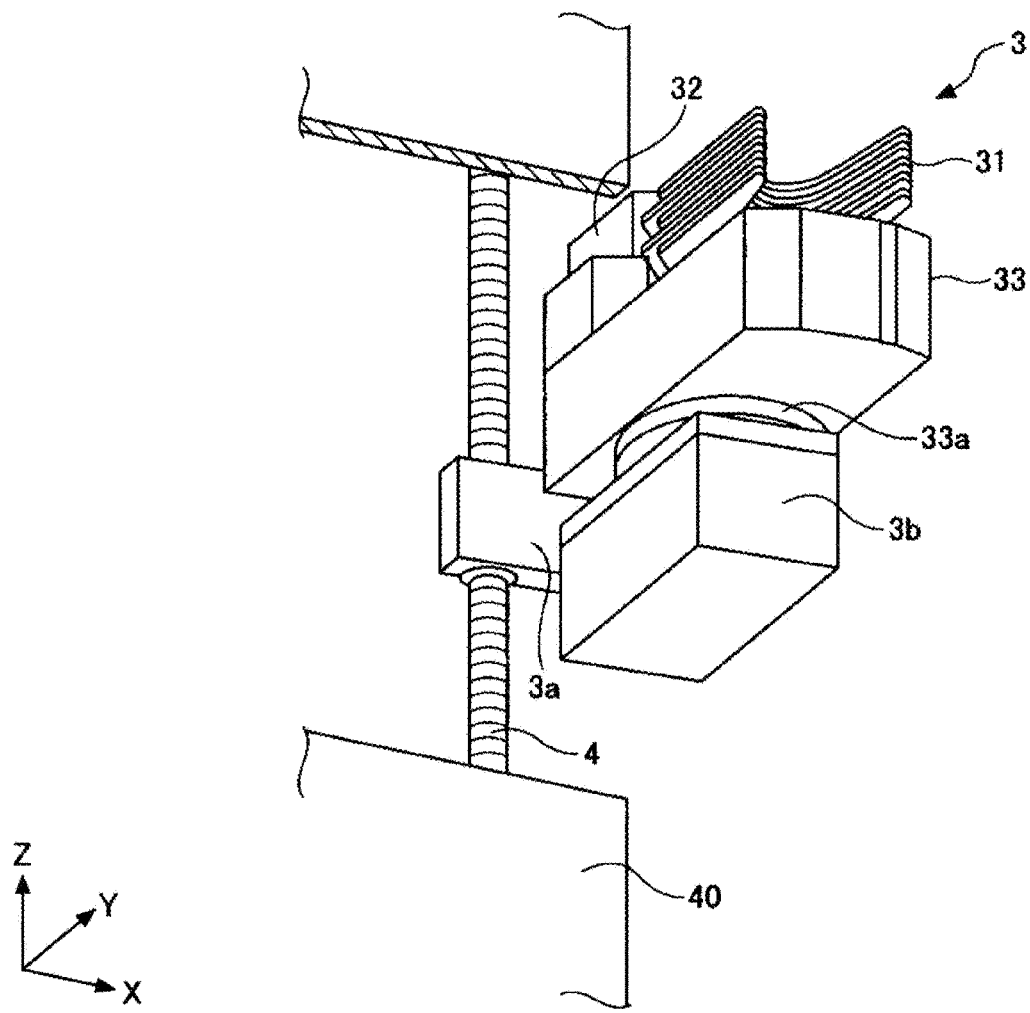
FIG. 3 is an enlarged view of a wafer transfer arm of the substrate transfer system according to the first embodiment of the present disclosure.

First, with reference to FIGS. 1 to 3, an outline of a vertical heat treatment apparatus using a substrate transfer system according to the first embodiment of the present disclosure will be briefly described. FIG. 1 is a side view illustrating a schematic configuration of an example of a vertical heat treatment apparatus using a substrate transfer system according to a first embodiment of the present disclosure. As shown in FIG. 1, the vertical heat treatment apparatus includes a wafer boat 1 accommodating a plurality of wafers W in a shelf-like shape and a vertical-type processing container 2 receiving the wafer boat 1 airtightly and performing heat treatment. Further, a wafer transfer arm 3 for moving and loading the wafer W to the wafer boat 1 is installed as a substrate transfer mechanism.

The wafer transfer arm 3 is installed within a load area 10, and the load area 10 includes a substrate transfer area 10a in which the wafer W is transferred by the wafer transfer arm 3, and a holder stand-by area 10b in which the wafer boat 1 is in a stand-by state at a lower side of the processing container 2. The load area 10 is surrounded by a load area housing 250. Further, for convenience of description hereinafter, a direction in which the wafer boat 1 and the wafer transfer arm 3 are arranged is referred to as "a front-rear direction (the wafer boat 1 is in a front side, and the wafer transfer arm 3 is in an inner side)", and a direction horizontally orthogonal to the front-rear direction when viewing the wafer transfer arm 3 from the wafer boat 1 is referred to as "a left-right direction".

First, an entire configuration of the vertical heat treatment apparatus will be briefly described. In an upper side of the holder stand-by area 10b for moving and loading the wafer W to the wafer boat 1, the processing container 2 is disposed. The substrate transfer area 10a is adjacent to an inner side (X-direction in FIG. 1) of the holder stand-by area 10b. In an inner side of the substrate transfer area 10a, a working area 12 for performing transfer and storage of a front opening unified pod (FOUP) 11 is formed. In the working area 12, a loading part 21, a transfer stage 22 and a carrier transfer device 23 are installed. The loading part 21 is a part on which the FOUP 11 is loaded by a transfer mechanism (not shown) disposed outside the vertical heat treatment apparatus. The transfer stage 22 is adjacent to the wafer transfer arm 3. The carrier transfer device 23 moves and loads the FOUP 11 loaded in the loading part 21 to the transfer stage 22. The empty FOUP 11 from which the wafers W are taken out is stored in a storage part 24 in an upper side of the loading part 21, and the wafer W having finished its process returns to the original FOUP 11 and is unloaded from the apparatus.

The wafer transfer arm 3 is configured to be movable to upper-lower direction by a ball screw 4. Moreover, in an upper part near the ball screw 4, e.g., a ceiling surface of the load area housing 250, an upper exhaust port 50 is formed. In a lower part near the ball screw 4, e.g., a bottom surface of the load area housing 250, a lower exhaust port 51 is formed. Further, a detailed configuration thereof will be described later.

The entire vertical heat treatment apparatus is surrounded by a housing 25 forming an outer wall part, and a door 26 is installed in the housing 25. A wall surface part between the working area 12 and the substrate transfer area 10a constitutes a part of the housing 25 and partitions the working area 12 from the substrate transfer area 10a. A transfer port (opening part) 28 for performing transfer of the wafer W can be opened/closed by a shutter 27 installed in the wall surface part. Moreover, while in the upper side of the holder stand-by area 10b, a heater for heating the wafer W within the processing container 2, an opening/closing mechanism for opening/closing a furnace opening of a lower opening part of the processing container 2, a gas supply system for supplying a processing gas (a film forming gas) into the processing container 2, and so forth are installed, those are schematically illustrated in FIG. 1. Further, the working area 12 is not shown in other drawings except for FIG. 1.

FIG. 2 is a plan view showing a configuration of an example of the heat treatment apparatus using the substrate transfer system according to the first embodiment of the present disclosure. With reference to FIGS. 1 and 2, a layout of respective parts in the substrate transfer area 10a and the holder stand-by area 10b will be described in detail. In the areas 10a and 10b, the wafer transfer arm 3 and the wafer boat 1 are arranged in this order from the inner side to the front side as described above. In an area biased to one side (left side in FIG. 2) of the wafer transfer arm 3 when seen in a plan view, the ball screw 4 extending in a upper-lower (vertical) direction along the longitudinal direction of the wafer boat 1 is disposed so as to move up and down the wafer transfer arm 3, as shown in FIGS. 1 and 2. The ball screw 4 is disposed to penetrate an elevating base member 3a and is configured to be rotatable around a vertical axis by a driving part 4a installed, for example, at a lower side of a bottom surface 254. Moreover, in the elevating base member 3a, a support part 3b horizontally extending toward the wafer transfer arm 3 is installed. In order to show the ball screw 4 in FIG. 1, the ball screw 4 is shown by being shifted laterally (to the shutter 27 side). Further, in an upper end part of the ball screw 4, for example, a bearing part (not shown) and so forth are installed to support the ball screw 4 such that the ball screw 4 can rotate around a vertical axis.

FIG. 3 is an enlarged view of the wafer transfer arm 3. As shown in the FIG. 3, the wafer transfer arm 3 includes a plurality of forks 31 respectively holding the wafers W from a lower side and an advancing/retreating part (transfer base member) 32 supporting and holding the forks 31 such that the forks 31 are capable of advancing and retreating, and is configured to be rotatable around a vertical axis by a rotation mechanism 33a installed below a base part 33 supporting the advancing/retreating part 32. A leading end of the support part 3b is connected to the rotation mechanism 33a, and the other end of the support part 3b is connected to the elevating base member 3a. The wafer transfer arm 3 is configured to move up and down at an elevating speed, which is faster than 400 mm/s, ranging from 450 mm/s to 600 mm/s, e.g., 560 mm/s, together with the elevating base member 3a and the support part 3b when the ball screw 4 rotates around a vertical axis. An elevating stroke of the wafer transfer arm 3 is set to, for example, 1.5 m.

As shown in FIG. 1, the wafer boat 1 is configured to accommodate a plurality of wafers W, e.g., 100 sheets, in a shelf-like shape, and is capable of elevating by an elevating mechanism 1a shown in FIG. 2 between an upper position in which the wafer boat 1 is inserted into the processing container 2 and a heat treatment is performed, and a lower position in which the wafer W is moved and loaded to the wafer boat 1 by the wafer transfer arm 3. A height of an area of the wafer boat 1 in which the wafer W is accommodated is, for example, 1 m. Since the wafer W is transferred by the wafer transfer arm 3 with respect to the wafer boat 1, the holder stand-by area 10b may be considered to form a part of the substrate transfer area 10a.

In the substrate transfer area 10a and the holder stand-by area 10b, laminar gas flow which horizontally flows is formed in the front-rear direction to an area of one side (left side) in which the ball screw 4 is disposed from an area of the other side (right side) opposite to the area of one side, and in the longitudinal direction of the ball screw 4 (the wafer boat 1). Specifically, in the right side of the respective areas 10a and 10b, as shown in FIG. 2, in order to supply a clean gas, e.g., the air or nitrogen ($N_2$) gas, to the areas 10a and 10b, box-shaped gas supply parts 34 accommodating therein cleaning filters (filter material) 35 are installed in, for example, two places separated from each other in the front-rear direction. Further, a cover 40 is installed so as to cover an elevating mechanism 5 including the ball screw 4 and the driving part 4a, and the elevating mechanism 1a for the wafer boat 1. The cover 40 prevents particles scattering from grease of the ball screw 4 to the substrate transfer area 10a and the holder stand-by area 10b within the load area 10 from being stuck to the wafer W.

Figure 4:
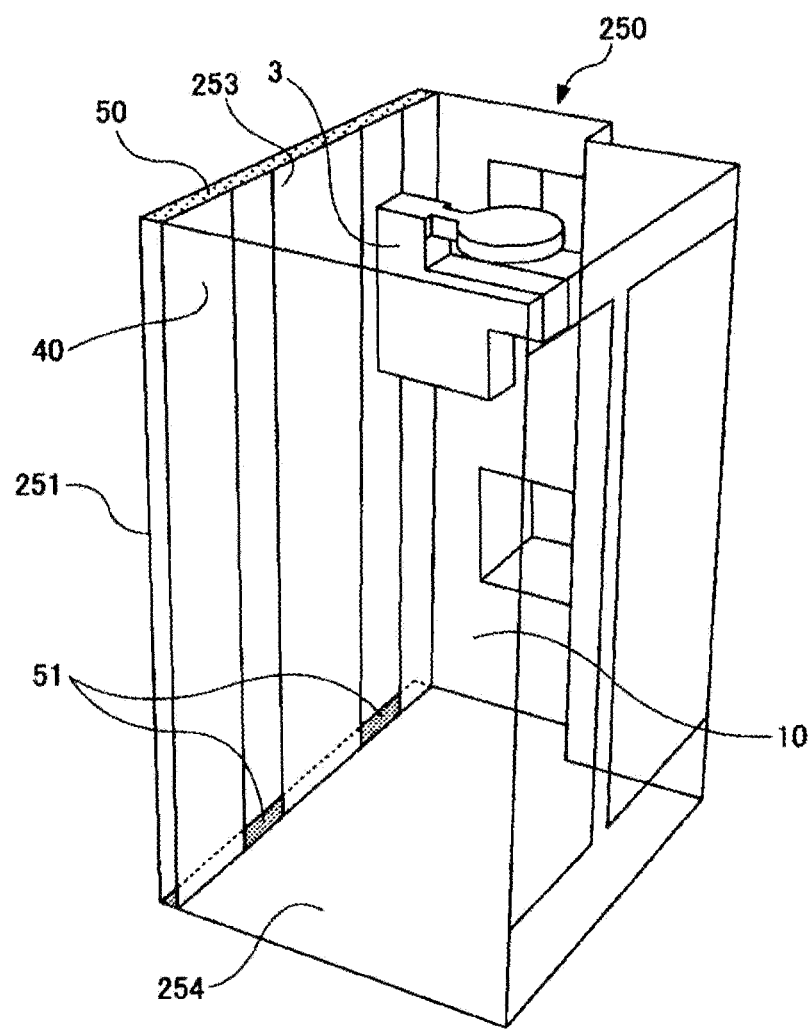
FIG. 4 is an explanatory view illustrating an exhaust configuration of the substrate transfer system according to the first embodiment of the present disclosure.

Next, with reference to FIG. 4, an exhaust configuration of the substrate transfer system according to the first embodiment of the present disclosure will be described. FIG. 4 is a view illustrating the exhaust configuration of the substrate transfer system according to the first embodiment of the present disclosure. In FIG. 4, the wafer transfer arm 3 is installed within the load area housing 250 surrounding the load area 10, and the upper exhaust port 50 is formed in an upper end of a wall surface 251 adjacent to the wafer transfer arm 3 while the lower exhaust port 51 is formed in a lower end thereof. The upper exhaust port 50 is an exhaust port for discharging the particles generated from grease of the ball screw 4 and so forth from an upper side. Further, the lower exhaust port 51 is an exhaust port for discharging the particles generated from grease of the ball screw 4 and so forth from a lower side.

As described above, a combination of the ball screw 4 and the driving part 4a is used as the elevating mechanism 5 for the wafer transfer arm 3. However, since grease is applied to the ball screw 4 for lubrication, the particles are frequently generated from the grease. Many particles are generated when the wafer transfer arm 3 is moved up and down and, specifically, many of them are generated when the wafer transfer arm 3 descends.

Figure 5:
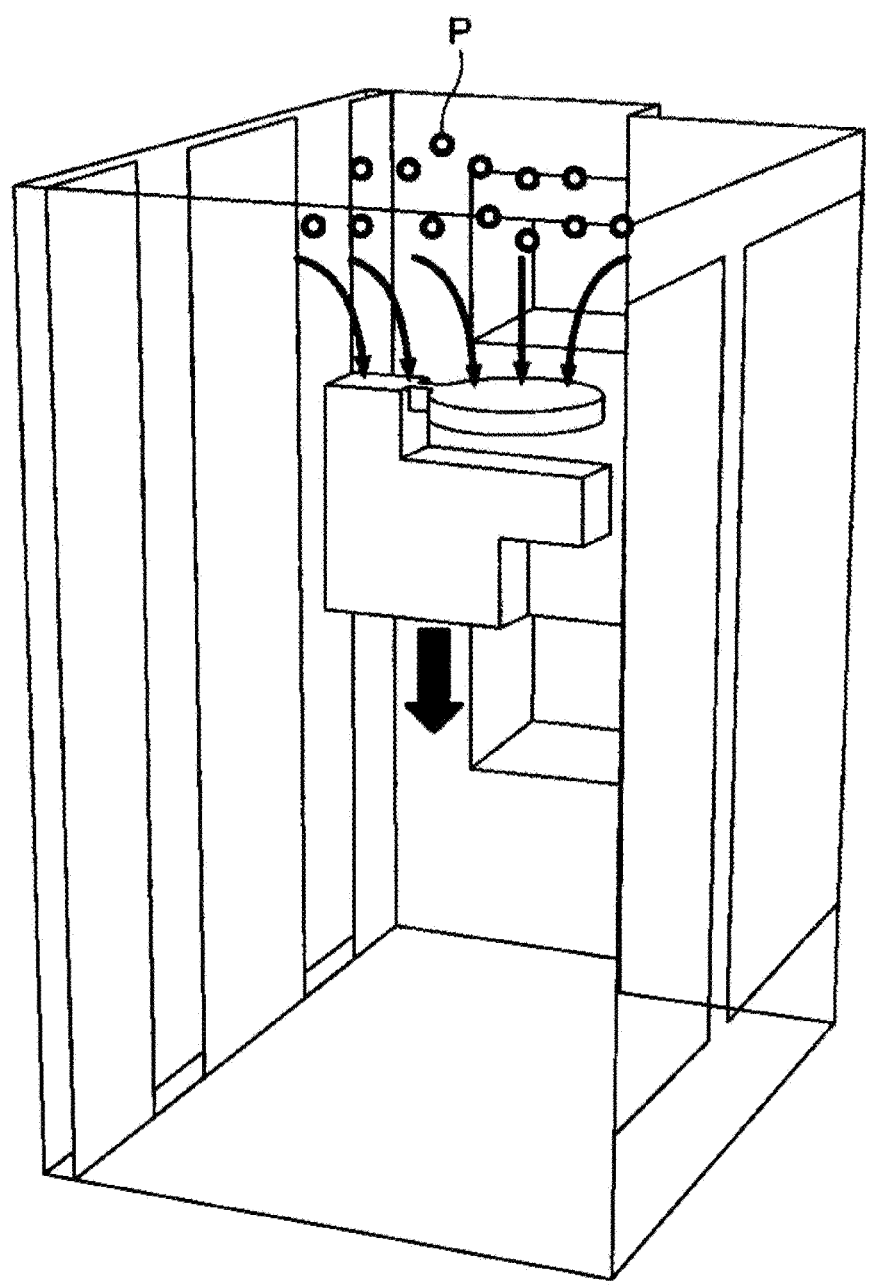
FIG. 5 is a view illustrating a phenomenon where particles are generated when the wafer transfer arm descends.

FIG. 5 is a view illustrating a phenomenon of particle generation when the wafer transfer arm 3 descends. As shown in FIG. 5, the number of particles P generated when the wafer transfer arm 3 descends is increased by increasing a descending speed, and the particles P are generated in an upper side of the wafer transfer arm 3. In other words, that is because, when a movement speed of the wafer transfer arm 3 is increased, a rotation speed of the ball screw 4 is also increased, thereby making it easy for the particles to be scattered. Further, that is also because a negative pressure area is temporarily made at a rear side in the movement direction by the movement of the wafer transfer arm 3, so that the particles from the ball screw 4 are drawn into the load area side. In addition, if there is no other exhaust port except for the lower exhaust port 51, an exhaust flow rate becomes high in the lower side of the ball screw 4 and low in the upper side thereof. Therefore, when the wafer transfer arm 3 ascends, a degree at which the particles are drawn in becomes low, even if the negative pressure is generated in the rear side in the movement direction. However, when the wafer transfer arm 3 descends, the negative pressure is generated in a part where the exhaust flow rate is low, thereby making it easy for the particles from the ball screw 4 to reverse flow to the side of the load area 10. For that reason, when the wafer transfer arm 3 descends, the particles are generated in the upper side of the wafer transfer arm 3. When the movement speed of the wafer transfer arm 3 is set to fall within a range from 500 mm/sec to 700 mm/sec, e.g., 560 mm/sec, proper throughput is obtained while many particles P are generated. On the other hand, when the movement speed of the wafer transfer arm 3 is decreased, the generation of the particles P can be suppressed. However, throughput is reduced and productivity gets worse. For example, when the movement speed of the wafer transfer arm 3 is set to be a value e.g., 280 mm/sec, 400 mm/sec or the like, the generation of the particles P can be suppressed. However, satisfactory throughput can not be obtained. Therefore, there is a need for a substrate transfer system which can suppress the generation of the particles P without lowering the movement speed of the wafer transfer arm 3.

Therefore, in the substrate transfer system according to the first embodiment of the present disclosure, exhaust is strongly performed at the upper side of the wafer transfer arm 3 by forming the upper exhaust port 50 in the upper side as shown in FIG. 4, so that the particles generated in the upper side of the wafer transfer arm 3 are discharged from the interior of the load area 10. In other words, by forming the upper exhaust port 50 above the wafer transfer arm 3, the particles generated when the wafer transfer arm 3 moves downward are sucked and discharged outside the load area 10.

Moreover, as for the position of the upper exhaust port 50, in some embodiments, the upper exhaust port 50 is preferably formed above the wafer transfer arm 3, and is preferably formed on the axis of the ball screw 4 or in a position near the axis of the ball screw 4. Therefore, in terms of its height, the upper exhaust port 50 is preferably formed above the upper limit of the moving range of the wafer transfer arm 3 in the upper-lower direction. Further, as for a position when seen in a plan view, the upper exhaust port 50 is preferably formed on the axis of the ball screw 4 or in the position near the axis of the ball screw 4. In this regard, in the substrate transfer system according to the embodiment, the upper exhaust port 50 is formed in a ceiling surface 253 of the load area housing 250 within the cover 40 near the ball screw 4 (outside of the cover 40). However, as long as the conditions described above are satisfied, the upper exhaust port 50 can be formed in a variety of positions. Therefore, the upper exhaust port 50 is not necessarily formed in the ceiling surface 253 of the load area housing 250, and a configuration is available, in which a duct is installed at, for example, a position above the axis of the ball screw 4 of the wall surface 251. In addition, while the upper exhaust port 50 is formed to cover an entire end portion of the ceiling surface 253, as shown in FIG. 4, the upper exhaust port 50 may be formed in only a narrower area as long as the particles generated from the ball screw 4 can be sufficiently discharged.

Similarly, since, when the wafer transfer arm 3 moves upward, the particles are generated below the wafer transfer arm 3, the lower exhaust port 51 is also formed at a lower side of the wafer transfer arm 3. The lower exhaust port 51 is also, in some embodiments, preferably formed below the lower limit of the moving range of the wafer transfer arm 3 in the upper-lower direction. Moreover, when seen in a plan view, the lower exhaust port 51 is preferably formed near the ball screw 4 in the same manner, and is preferably formed on the axis of the ball screw 4 or near the axis of the ball screw 4. In, FIG. 4, the lower exhaust port 51 is formed in the bottom surface 254 of the load area housing 250 within the cover 40 near the ball screw 4 (outside of the cover 40).

In this way, the exhaust is performed from both the upper position and the lower position of the elevating mechanism 5 by forming the upper exhaust port 50 above the upper limit of the elevating range of the wafer transfer arm 3 on or near the axis of the ball screw 4, and forming the lower exhaust port 51 below the lower limit of the elevating range of the wafer transfer arm 3 on or near the axis of the ball screw 4, whereby it is possible to suppress contamination of the wafer by the particles.

Figure 6:
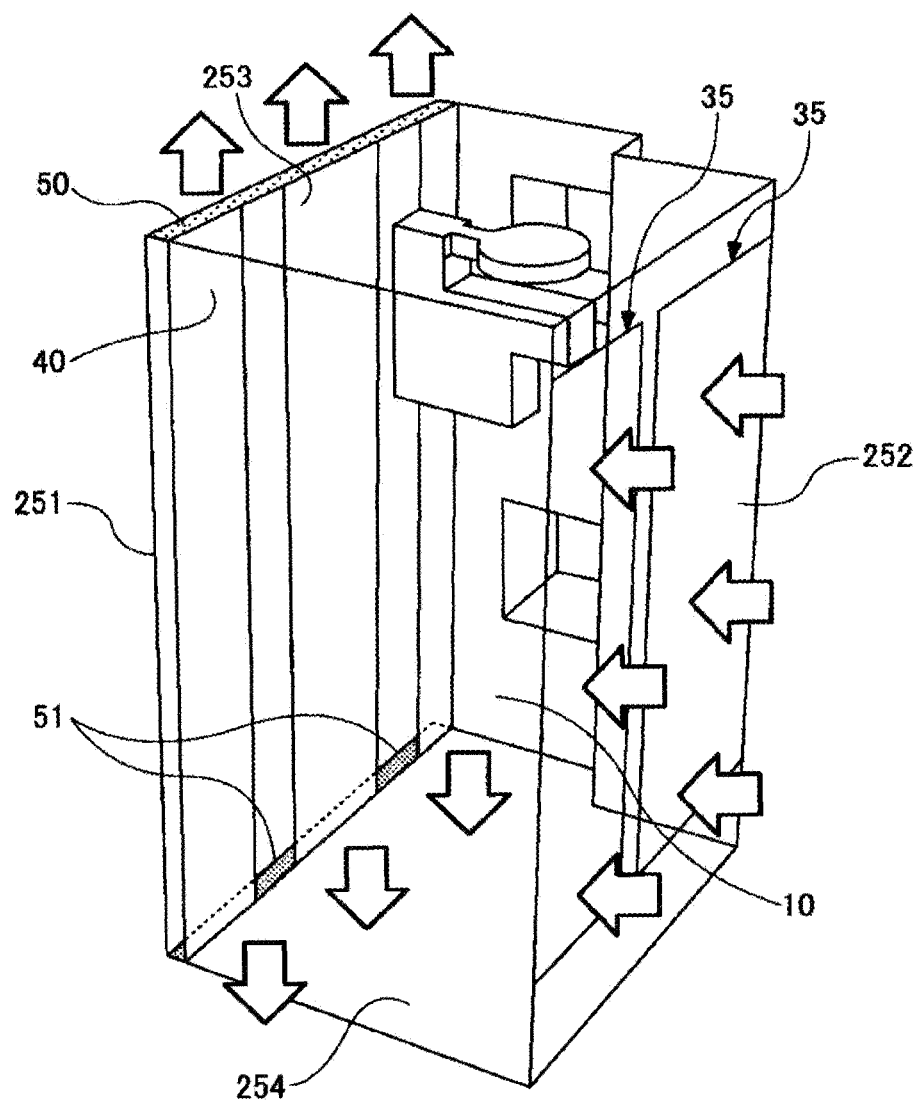
FIG. 6 is a view illustrating an example of gas flow within a load area in the substrate transfer system according to the first embodiment of the present disclosure.

FIG. 6 is a view illustrating an example of gas flow within the load area 10 in the substrate transfer system according to the first embodiment of the present disclosure. As shown in FIG. 6, gas flow is formed within the load area 10, in which the clean gas is horizontally supplied from the wall surface 252 of the load area housing 250 at a side of the gas supply part 34 (see FIG. 2) having the cleaning filter 35 to the wall surface 251, and is discharged from the upper exhaust port 50 and the lower exhaust port 51.

Figure 7:
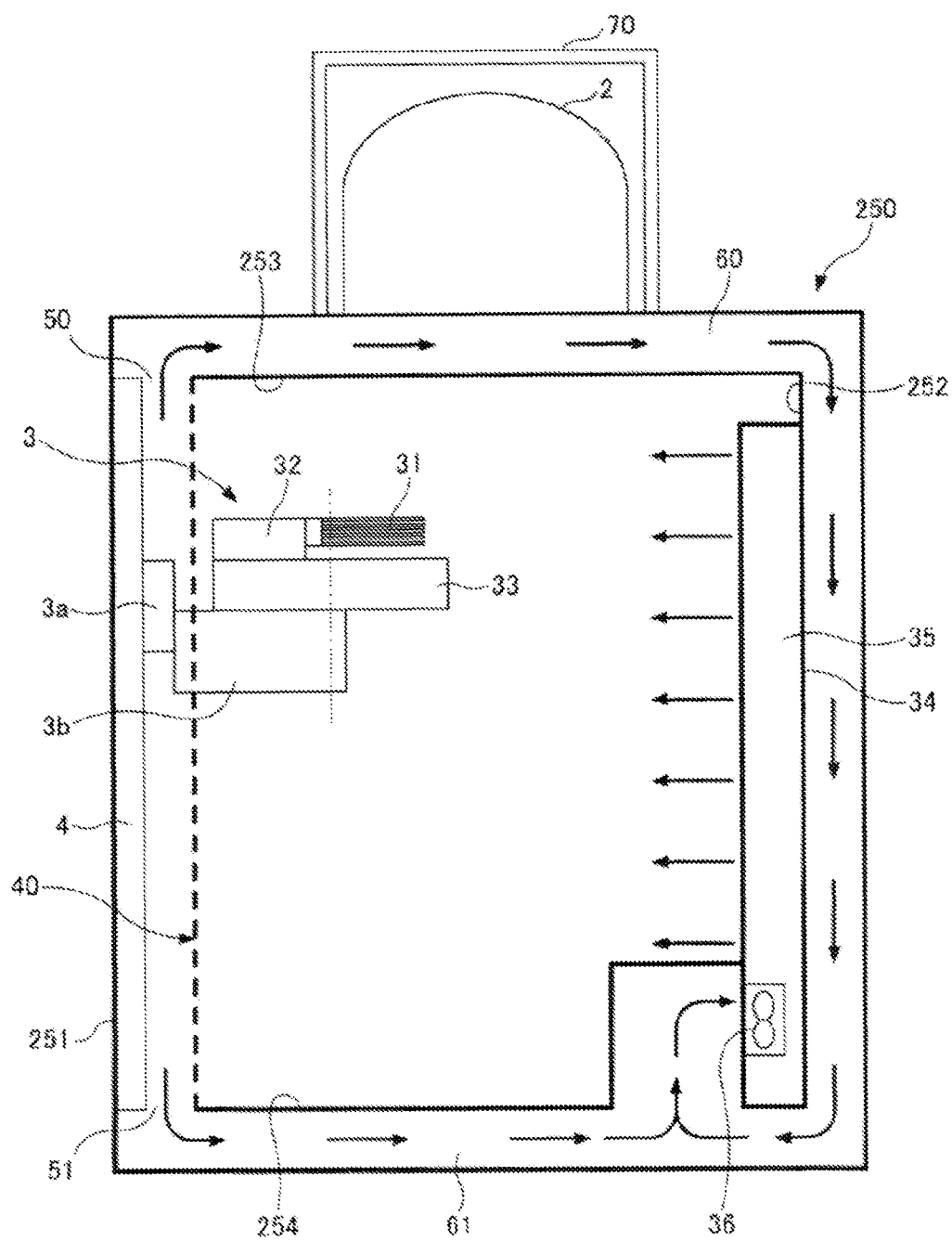
FIG. 7 is a view illustrating an entire exhaust system of an example of the substrate transfer system according to the first embodiment of the present disclosure.

FIG. 7 is a view illustrating an entire exhaust system of an example of the substrate transfer system according to the first embodiment of the present disclosure. As shown in FIG. 7, the ball screw 4 which serves to move the wafer transfer arm 3 in the vertical direction is covered by the cover 40, the upper exhaust port 50 is formed at the upper side, and the lower exhaust port 51 is formed at the lower side. The upper exhaust port 50 is connected to an exhaust route 60 installed above the ceiling surface 253 of the load area 10, and the exhaust route 60 communicates with an exhaust fan 36. Further, the lower exhaust port 51 is connected to an exhaust route 61 installed below the bottom surface 254, and the exhaust route 61 communicates with the exhaust fan 36 in the same manner. The exhaust fan 36 sends a gas including the particles sucked from the upper exhaust port 50 and the lower exhaust port 51 to the cleaning filter 35. As the cleaning filter 35, an air filter removing particles such as trash, dirt, dust and so forth, from the air, for example, a High Efficiency Particulate Filter (HEPA), an Ultra Low Penetration Filter (ULPA) or the like, may be used. In addition, a variety of cleaning filters capable of removing particles may be used. Further, a heater 70 is a heating means for heating the processing container 2, and is used in the case where the substrate transfer system according to the embodiment is applied to a vertical heat treatment apparatus. The heater 70 is not always necessary if the substrate transfer system is used in other processing apparatuses.

Moreover, as described in FIG. 6, the gas flow is formed in the load area 10 in such a way that the clean gas is substantially horizontally supplied from the wall surface 252 in which the gas supply part 34 is installed, to the wall surface 251 in which the wafer transfer arm 3 is installed, and is discharged from the upper exhaust port 50 formed in the ceiling surface 253 and the lower exhaust port 51 formed in the bottom surface 254. Further, the gas is sent to the cleaning filter 35 via the exhaust routes 60 and 61 by suction from the exhaust fan 36, and then the cleaned gas is supplied from the gas supply part 34. In this way, a circulation route of the clean gas is formed. By the clean gas circulation route, the scattering of the particles within the load area 10 can be suppressed, and the cleaned gas can be continuously supplied into the load area 10, whereby the interior of the load area 10 can be maintained in a clean condition at all times. In addition, the clean gas can be properly selected among air, nitrogen gas, or the like according to usage. Moreover, the flow rate of the gas supplied from the gas supply part 34 may be set to fall within a range, for example, from 0.2 m/s to 0.5 m/s, or be 0.3 m/s. Further, the exhaust amount may be independently controlled by installing individual exhaust fans in the exhaust routes 60 and 61. In this way, it is possible to properly control the exhaust speed even if the exhaust flow rates near the upper exhaust port 50 and the lower exhaust port 51 are different due to the flow path length difference between the exhaust routes 60 and 61, or even if the elevating speed of the wafer transfer arm 3 is different, whereby it is possible to surely reduce the particle involvement.

Figure 8A:
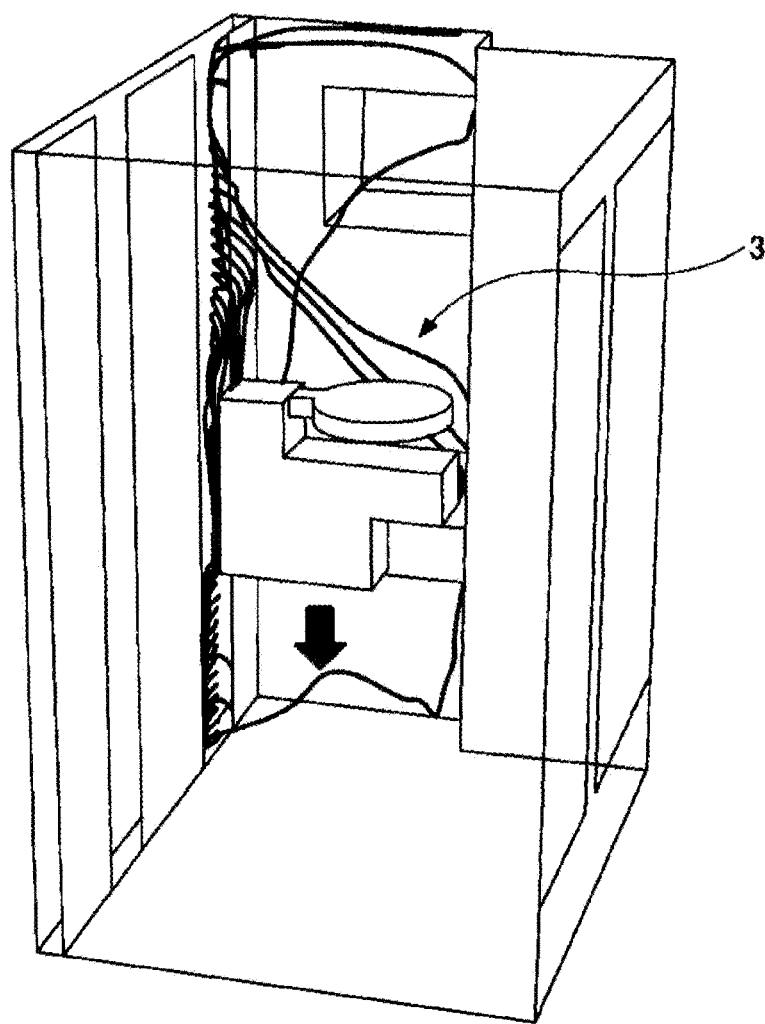
FIGS. 8A and 8B are views illustrating simulation results of gas flows which occur when the wafer transfer arm descends in a conventional substrate transfer system and the substrate transfer system according to the first embodiment of the present disclosure, respectively.
Figure 8B:
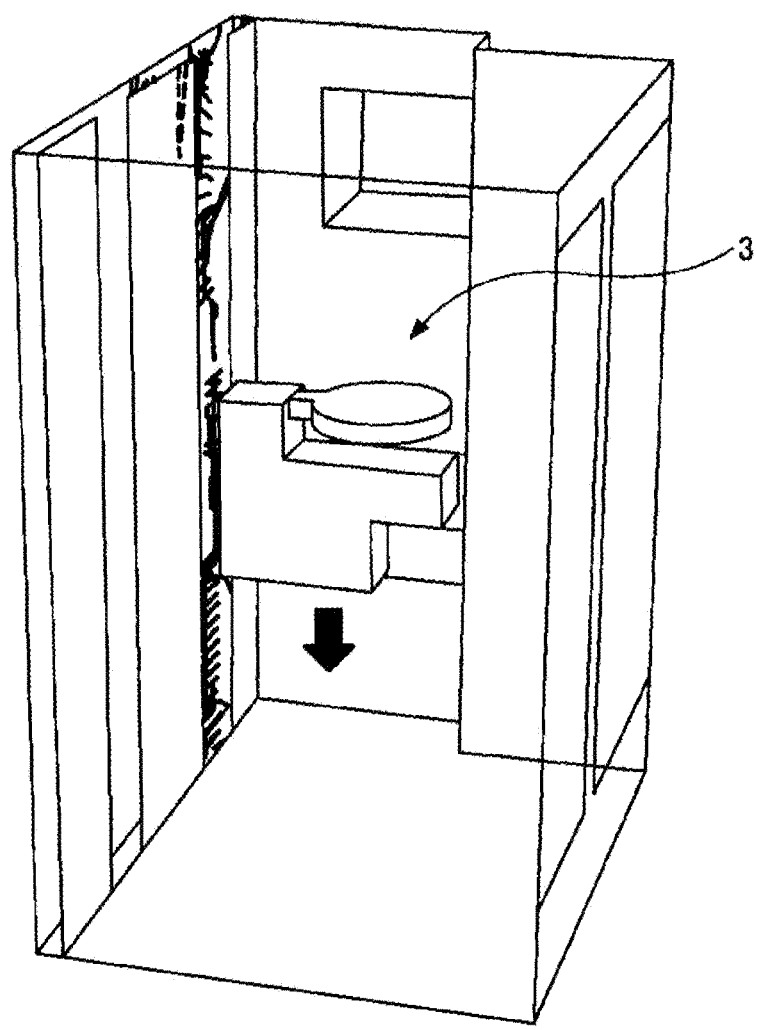

FIGS. 8A and 8B are views illustrating simulation results of gas flows which occur when the wafer transfer arm 3 descends in a conventional substrate transfer system and the substrate transfer system according to the first embodiment of the present disclosure, respectively. FIG. 8A is a view illustrating the simulation result of the gas flow which occurs when the wafer transfer arm 3 descends in the conventional substrate transfer system, and FIG. 8B is a view illustrating the simulation result of the gas flow which occurs when the wafer transfer arm 3 descends in the substrate transfer system according to the first embodiment of the present disclosure. In both cases of FIGS. 8A and 8B, simulations were conducted under the conditions where the flow rate of the clean gas supplied from the gas supply part 34 (see FIG. 7) was 0.3 m/s and the moving speed of the wafer transfer arm 3 was 560 mm/s.

In both cases of FIGS. 8A and 8B, the gas flows generated when the wafer transfer arm 3 descends are shown in bold solid line. In comparison between the FIGS. 8A and 8B, while disturbance of the gas flow occurs above the wafer transfer arm 3 in the conventional substrate transfer system shown in FIG. 8A, the gas flow hardly occurs even if the wafer transfer arm 3 descends in the substrate transfer system according to the first embodiment shown in FIG. 8B. As described above, it can be known that the gas flow occurring when the wafer transfer arm 3 descends is substantially reduced in the substrate transfer system according to the first embodiment of the present disclosure.

In the first embodiment of the present disclosure, the substrate transfer system related to suppressing the particle generation when the wafer transfer arm 3 moves in the upper-lower direction has been described. However, in the substrate transfer system according to the embodiment of the present disclosure, it is possible to suppress particle generation when the wafer transfer arm 3 rotates in a horizontal direction as necessary. In this regard, a substrate transfer system having such a feature will be described in a second embodiment of the present disclosure.

Figure 9:
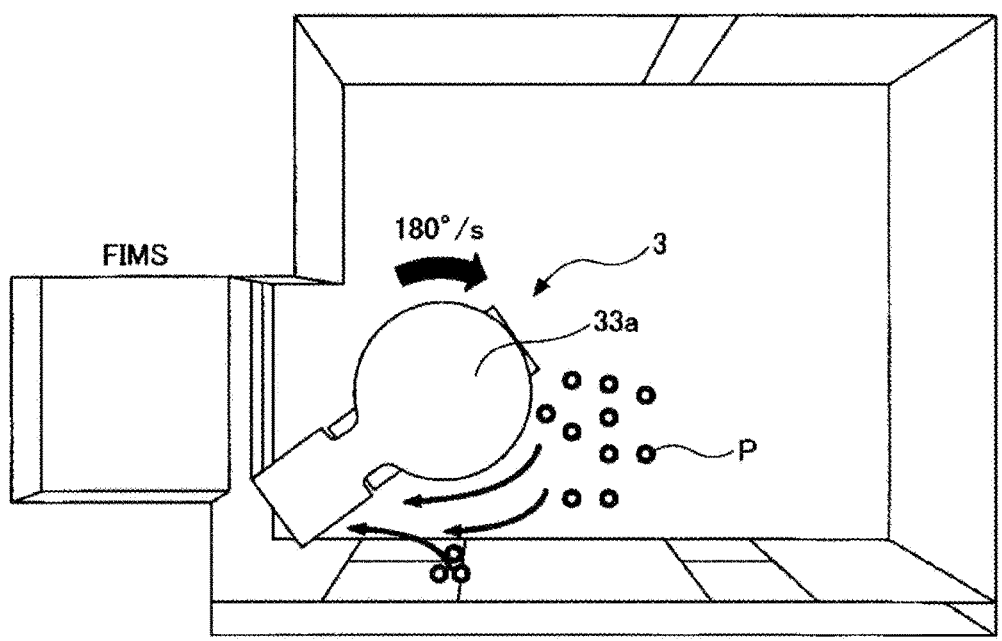
FIG. 9 is a view illustrating a phenomenon that particles are generated when the wafer transfer arm is rotated in a horizontal direction.

FIG. 9 is a view illustrating a phenomenon that the particles P are generated when the wafer transfer arm 3 is rotated in a horizontal direction. As shown in FIG. 9, when the wafer transfer arm 3 is rotated from a position in which the fork 31 faces the gas supply part 34 side, about the axis of the rotation mechanism 33a, at 180°/s of velocity, a phenomenon that the particles P fly up so as to be drawn into a rotation occurs.

Figure 10A:
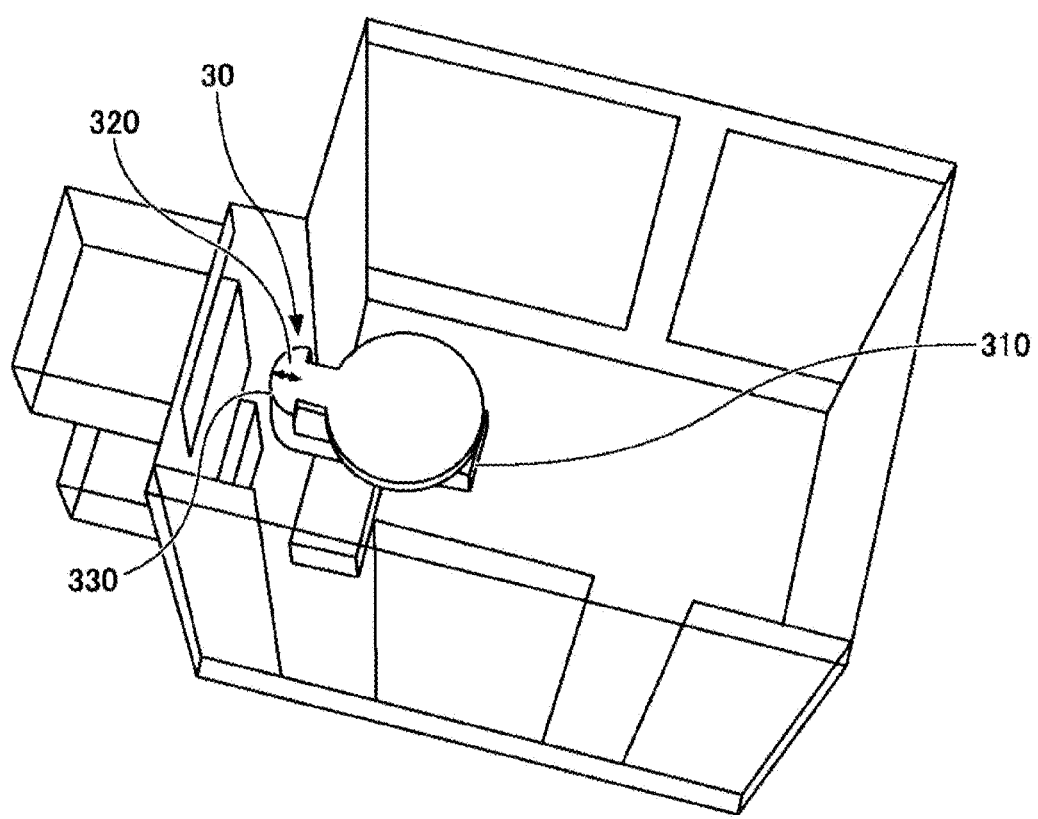

FIGS. 10A and 10B are views for explaining an example of a substrate transfer system according to a second embodiment of the present disclosure. FIG. 10A is a view illustrating an example of the substrate transfer system according to the second embodiment. The wafer transfer arm 30 in the substrate transfer system according to the second embodiment is different from the wafer transfer arm 3 according to the first embodiment, in a shape of an end portion of an advancing/retreating part 320 and a base part 330 (i.e., an arm portion except for the fork), which is opposite to the fork 310 holding the wafer. The outward shape of the end portion of the advancing/retreating part 320 and the base part 330, which is opposite to the fork 310, is a shape having no corners, i.e., a rounded shape. Further, the rounded shape may be a variety of shapes as long as it has no corners. The rounded shape may be, for example, an arc shape as shown in FIG. 10A. Since, when the wafer transfer arm 30 is rotated, the rounded shape is a shape having the least air resistance, generation of the particles can be effectively suppressed.

Moreover, the substrate transfer system according to the second embodiment of the present disclosure is different from the substrate transfer system according to the first embodiment in that the lengths of the advancing/retreating part 320 and the base part 330 which are opposite to the fork 310 holding the wafer of the wafer transfer arm 30 are shorter than those of the wafer transfer arm 3 of the substrate transfer system according to the first embodiment.

FIG. 10B is a view illustrating the wafer transfer arm 3 of the substrate transfer system according to the first embodiment. In the wafer transfer arm 3 of the substrate transfer system according to the first embodiment, the end portion of the advancing/retreating part 32 and the base part 33 which is opposite to the fork 31 has a rectangular shape, and lengths of the advancing/retreating part 32 and the base part 33 are longer than those of the wafer transfer arm 30 in FIG. 10A.

For example, if the lengths of the advancing/retreating part 32 and the base part 33 which are opposite to the fork 31 of the wafer transfer arm 3 are set to be about 150 mm, the lengths of the advancing/retreating part 320 and the base part 330 which are opposite to the fork 310 of the wafer transfer arm 30 ranges from about 65 mm to about 70 mm, i.e., about ½ of the lengths in the wafer transfer arm 3.

By adopting the shape described above, it is possible to suppress generation of the particles even if the wafer transfer arm 30 is rotated.

Figure 11A:
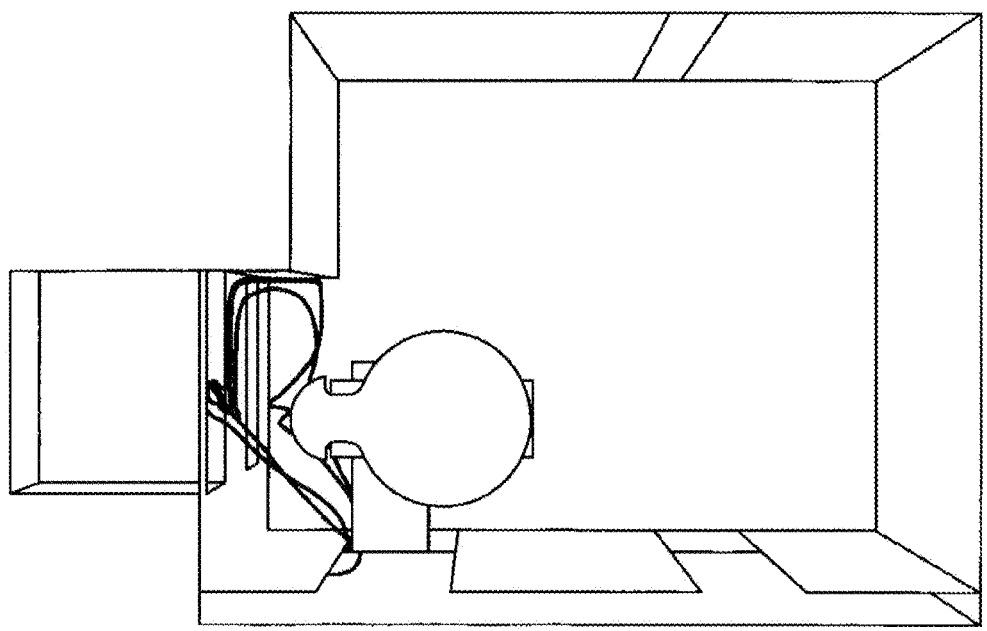
FIGS. 11A and 11B are simulation views illustrating speeds of gas flows which occur when a wafer transfer arm according to the second embodiment and the wafer transfer arm according to the first embodiment are rotated, respectively.
Figure 11B:
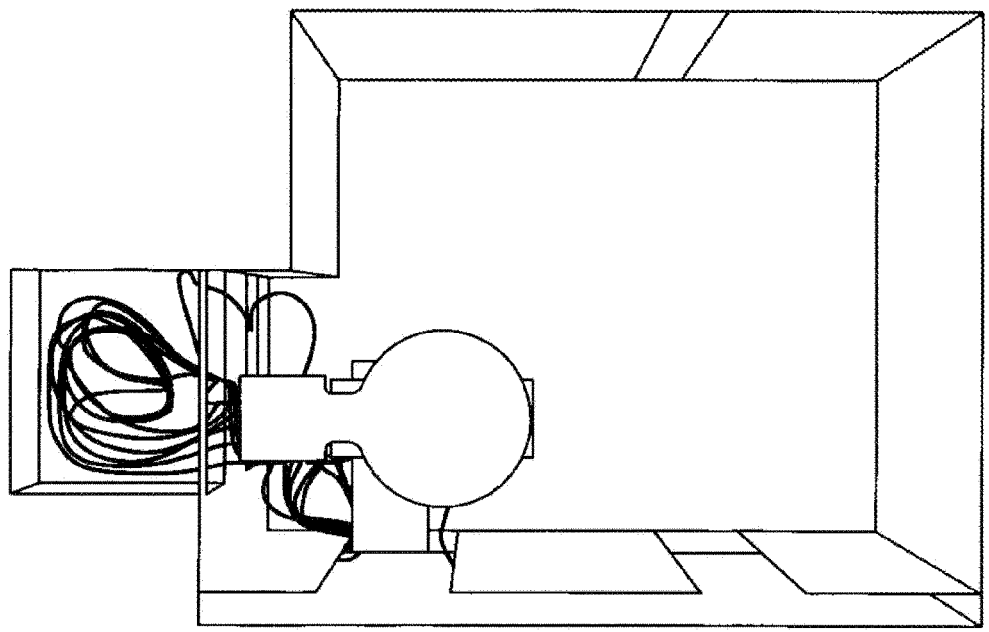

FIGS. 11A and 11B are simulation views illustrating speeds of gas flows occurring when the wafer transfer arm 30 according to the second embodiment and the wafer transfer arm 3 according to the first embodiment are rotated, as in FIG. 9, respectively. FIG. 11A is a view illustrating the gas flow occurring when the wafer transfer arm 30 according to the second embodiment is rotated, and the FIG. 11B is a view illustrating the gas flow occurring when the wafer transfer arm 3 according to the first embodiment is rotated.

As can be seen from comparison between FIGS. 11A and 11B, the case where the wafer transfer arm 30 according to the second embodiment is rotated has disturbance of the gas flow less than the case where the wafer transfer arm 3 according to the first embodiment is rotated. In other words, in FIG. 11B, an area in which the gas flows at a high speed from the gap between the support part 3b of the wafer transfer arm 30 and the cover 40 to a rear area side in the rotation direction and the interior of the FOUP is formed. However, in FIG. 11A, it can be seen that an area of a high speed gas flow is greatly reduced. Therefore, it can be seen that the particles generated by horizontal rotation can be further suppressed by the wafer transfer arm 30 according to the second embodiment.

Since the first embodiment and the second embodiment can be combined together, the first embodiment and the second embodiment are combined together in order to suppress particles generated by the rotation in a horizontal direction as well as the movement in vertical direction of the wafer transfer arm 3.

Moreover, the substrate transfer system according to the embodiments of the present disclosure can be applied to a variety of substrate processing system as well as the vertical heat treatment apparatus.

According to the present disclosure, it is possible to effectively suppress contamination of substrates by particles generated when a substrate transfer means moves up and down.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A substrate transfer system comprising:
    a substrate transfer part capable of transferring a substrate while holding the substrate;
    an elevating mechanism including a support axis extending in an upper-lower direction and being capable of moving the substrate transfer part along the support axis within a predetermined range;
    a first exhaust port located at a position selected from at least one of on the support axis and near the support axis above an upper limit of the predetermined range;
    a second exhaust port located at a position selected from at least one of on the support axis and near the support axis below a lower limit of the predetermined range;
    an exhaust part connected such that exhaust is available through the first exhaust port and the second exhaust port;
    a first exhaust route located above the upper limit of the predetermined range; and
    a second exhaust route located below the lower limit of the predetermined range,
    wherein the first exhaust port and the second exhaust port are connected to the exhaust part through the first exhaust route and the second exhaust route, respectively.

2. The substrate transfer system of claim 1, wherein the elevating mechanism is installed near a wall surface; and
    wherein the first exhaust port and the second exhaust port are formed in a ceiling surface and a bottom surface which are near the wall surface, respectively.

3. The substrate transfer system of claim 2, wherein the wall surface, the ceiling surface and the bottom surface are those of a substrate loading chamber into which the substrate is loaded from a substrate accommodation container accommodating the substrate.

4. The substrate transfer system of claim 3, wherein the substrate accommodation container is a FOUP; and
    wherein the substrate transfer part transfers the substrate from the FOUP installed in a predetermined position outside the substrate loading chamber.

5. The substrate transfer system of claim 3, further comprising a cleaning filter,
    wherein the exhaust part supplies a gas discharged through the first exhaust port and the second exhaust port to an interior of the substrate loading chamber via the cleaning filter so as to circulate the gas.

6. The substrate transfer system of claim 5,
    wherein the cleaning filter is installed to face the wall surface; and
    wherein the circulated gas is supplied towards the wall surface from the cleaning filter.

7. The substrate transfer system of claim 5,
    wherein the exhaust part is an exhaust fan integrally formed with the cleaning filter.

8. The substrate transfer system of claim 5,
    wherein the first exhaust route and the second exhaust route are installed outside the substrate loading chamber.

9. The substrate transfer system of claim 3,
wherein a substrate holder elevating mechanism is installed in the substrate loading chamber, a substrate holder capable of holding a plurality of substrates being able to be installed in the substrate holder elevating mechanism, and the substrate holder elevating mechanism capable of moving up and down the substrate holder; and
wherein the substrate transfer part transfers the plurality of the substrates from the substrate accommodation container to the substrate holder installed in the substrate holder elevating mechanism.

10. A heat treatment apparatus comprising:
the substrate transfer system of claim 9,
a processing container installed above the substrate holder elevating mechanism and capable of accommodating the substrate holder by raising the substrate holder elevating mechanism; and
a heater heating the processing container.

11. The substrate transfer system of claim 1,
wherein the support axis is a ball screw; and
wherein the elevating mechanism includes a driving mechanism rotating the ball screw.

12. The substrate transfer system of claim 1,
wherein the elevating mechanism is covered with a cover.

13. The substrate transfer system of claim 1,
wherein the substrate transfer part includes:
a fork part including a finger-shaped contact-holding portion which makes contact with the substrate and holds the substrate; and
an arm part supporting the fork part rotatably on a rotation axis, and
wherein an end portion of the arm part opposite to the contact-holding portion about the rotation axis includes a shape having no corner.

14. The substrate transfer system of claim 13,
wherein the shape having no corner is an arc shape.

* * * * *